Aug. 3, 1971 J. B. RUST 3,597,204

METHOD OF PROVIDING INDUCTION PHOTOGRAPHY AND PRODUCT

Filed Oct. 3, 1966 2 Sheets-Sheet 1

John B. Rust
INVENTOR

BY [signature]

ATTORNEY.

Aug. 3, 1971 J. B. RUST 3,597,204

METHOD OF PROVIDING INDUCTION PHOTOGRAPHY AND PRODUCT

Filed Oct. 3, 1966 2 Sheets-Sheet 2

JOHN B. RUST,
INVENTOR

ATTORNEY.

United States Patent Office 3,597,204
Patented Aug. 3, 1971

3,597,204
METHOD OF PROVIDING INDUCTION PHOTOGRAPHY AND PRODUCT

John B. Rust, Los Angeles, Calif., assignor to Hughes Aircraft Company, Culver City, Calif.

Filed Oct. 3, 1966, Ser. No. 583,653
Int. Cl. G03c 5/00
U.S. Cl. 96—45.2 10 Claims

ABSTRACT OF THE DISCLOSURE

Improvement in the method of utilizing the induction period of photopolymer chemistry and improving the photographic speed of photopolymerizable compositions by the production of latent imaging in the induction period and effecting polymerization thereof in the photopolymerizable composition.

The present invention relates to an improvement in the method of formation of images in photosensitive photopolymeric form, including products thereof, and more particularly to a method for rapidly forming photopolymer images in photosensitive compositions containing polymerizable vinyl monomers and photopolymerization-initiating catalyst systems therefor.

It is well known that photopolymer images can be produced in photosensitive compositions of polymerizable ethylenic compounds as vinyl monomers and the like containing photosensitive polymerization initiators when such photo-sensitive compositions are irradiated with radiant energy having wavelengths lying in a wavelength region capable of absorption by the polymerization initiators to initiate polymerization of the photosensitive composition. Such compositions as indicated in U.S. Pat. No. 3,255,004 and the art noted therein are exemplary and utilizable in the herein described method. Irradiation thereof by radiation of appropriate wavelength is generally continued until a visible photopolymer image of desired optical density is produced in the photosensitive composition. The radiant energy for photopolymerization must be of sufficient magnitude to both remove inhibitors present in the photosensitive composition and to initiate polymerization of the photosensitive polymerizable composition. If the radiant energy source is incapable of supplying the radiant energy required to remove substantially all of the inhibitors in the photosensitive composition, no photopolymer image or mass will be observable. Thus, there is a time consuming waiting period and oftentimes an apparent lack of image polymerization with the use of radiant energy sources which appear unsuitable, or not to cause image photopolymerization.

It would thus be of extremely great advantage to provide a method and means for more rapidly producing visible photopolymer images in the aforementioned photosensitive compositions from latent images and thereby enable utilization of radiant energy sources which are presently unsuitable for use in photopolymerization processes. This would be especially desirable in view of the disclosure in a copending application of John B. Rust and Leroy J. Miller, entitled "Photopolymerization Photography—Reduction of Induction Period and Product," Ser. No. 583,652, and assigned to the instant assignee (hereafter designated as "said co-pending Rust-Miller application") wherein a novel method for reducing the amount of inhibitor or induction period has been described.

In view of the foregoing, it is a major object of this invention to provide a method for producing latent polymer images by visible light in light polymerizable photosensitive compositions and rendering visible said latent images, thereby effecting a reduction in the normal processing time of image reproduction, or visible replica reproduction, in a photosensitive composition utilizing a light sensitive or light activable polymerization system.

It is a further object of this invention to provide a method of producing visible photopolymer masses or images from initially visible or latent images, or image impressions, in photosensitive polymerizable compositions comprised of polymerizable vinyl monomers containing inherent, or added, photosensitive polymerization inhibitors, and the products thereof which are photopolymer masses or images in faithful replica or reproductions of the latent images.

It is another object of this invention to provide a method for producing visible photopolymer masses or images in photosensitive polymerizable compositions, which method can utilize extremely weak information-bearing energy sources, which were not utilizable for the production of visible photopolymer masses or images by prior art photopolymerization methods.

It is still another object of this invention to provide a method for more rapidly producing photopolymer images in photosensitive compositions comprised preferably of polymerizable vinyl monomers and a photosensitive polymerization initiator, which method can utilize radiation to produce, initially during the induction period, or thereafter, an invisible latent image, or copy, in said photosensitive composition and which can thereafter be developed into a visible image, or replica, by immediately following or subsequent exposure to a second radiant energy source.

Other objects and advantages will become apparent from the following description and from the drawings, in which.

Figure 1:
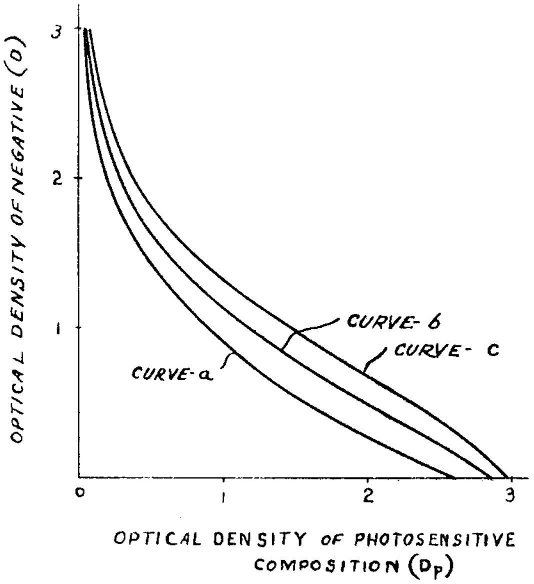
FIG. 1 is a graphical representation illustrating the relation between the optical density of a negative through which a particular photosensitive composition was exposed and the optical density of the developed visible photopolymer image produced in the photosensitive composition for varying latent image-forming exposure periods.

I have now discovered that the induction period, rather that being troublesome in requiring the use of excess radiation over that required for photopolymerization, per se, can be used to provide a latent image which, in turn, can be developed into a visible photopolymer image. More specifically, I have discovered that a visible photopolymer image can be produced in a photosensitive composition by: (1) initially irradiating a photosensitive composition with a low order of radiation, or momentarily with a bright order of irradiation, for a time less than or equal to the induction time associated with the wavelengths of maximum intensity within the incident radiation to produce a reproducible latent image, and (2) further uniformly irradiating the photosensitive composition with radiant energy for a time which is preferably less than, or no longer than, the induction period associated with the wavelengths of maximum intensity within the developing incident radiation, to thereby render the latent image discernible without fogging or polymerizing the areas of the photosensitive composition which were not initially exposed in step (1). Following the second or developing irradiation step, the photosensitive composition can be desensitized or fixed by any of the prior art methods, including control of pH and heating or addition of a soluble silver compound and heating, as disclosed in the herewith filed copending applications entitled "Photopolymer Polymerization Fixation Process and Products" of Leroy J. Miller and John B. Rust, Ser. No. 583,650 now Pat. No. 3,531,282, and "Photopolymer Fixation Process and Products" of John B. Rust, Ser. No. 583,649, now Pat. No. 3,531,281, incorporated herein by reference thereto, to thereby produce a visible photopolymer mass or image having a long life.

The radiant energy employed in both irradiation step (1) and developing step (2) must have wavelengths lying in a wavelength region capable of being absorbed by the photosensitive polymerization initiator to thereby effect different relative image areas and initiate polymerization of the vinyl monomer. However, the radiant energy used in steps (1) and (2) can differ in both wavelength and intensity, provided the foregoing limitation is met by each radiant energy source. Although the radiant energy normally employed in step (1) is capable of producing a visible photopolymer image if given sufficient time, only a latent image is produced in step (1) because the intensity of such radiant energy or the exposure time is too low or too short to produce a visible photopolymer image or because such radiant energy is controlled to produce only a latent image.

Hereafter, the term "actinic radiant energy" or "actinic light" will be used to describe radiant energy or light capable of being absorbed by the photosensitive polymerization initiator to initiate polymerization of the photosensitive composition, as exemplified by the herein described compositions of vinyl monomers. Additionally, hereafter, the terms "induction time" or "induction period" will denote the induction time or period associated with the wavelengths and intensity in a light source relative to the waiting period before visible polymerization appears in the photosensitive composition.

Photopolymerization by these steps permits the use of radiation during the initial latent image forming exposure (1), which is extremely weak or is of very short duration, before or after an initial induction period, in comparison to the radiation intensities used by the prior art, since only a latent image is required to be produced by the initial exposure. By requiring the production of only a latent image, shorter exposure periods than were required by the prior art may be employed. For the development step (2), the incident radiation may be obtained from any convenient radiant energy source and may be tailored to the requirements of a particular process. For example, if an extremely rapid development is required, radiation of high intensity (associated with a short induction period) can be used to produce a visible photopolymer image.

Herein the terms "photopolymer mass" and "photopolymer image" will be used interchangeably and will designate visible or discernible photopolymerization. The terms "light-sensitive composition" and "photosensitive composition" will be used interchangeably and will designate a composition comprising a photosensitive or light polymerizable composition of ethylenic monomers, and preferably vinyl monomers, and a photosensitive polymerization initiator as will be more specifically described and exemplified hereafter. The term "latent image" will designate a non-visible distribution of induction periods or of concentration of inhibitor, adventitiously present, or purposely added in a photosensitive composition, which induction periods have been reduced by varying fractions depending upon the intensity of the radiant energy incident to the photosensitive composition at each point in the composition.

A possible theory of the operation of my photopolymerization method will be described in connection with the following simplified mathematical analysis. However, any theory or theoretical discussion is not to be construed as limiting in any manner to the spirit and scope of this invention. First consider a photographic negative wherein each point on this negative will have associated with it an optical density D such that, if the front face is uniformly illuminated with light of intensity $I_o$, the light emerging from the back face will be I at that point due to said optical density D. The relationships which define this situation are:

$$D=\log(I_o/I)$$

or $$I=I_o 10^{-D} \quad (1)$$

With the photopolymer compositions of the present invention, it has been empirically determined that, if $t_o$ is an induction period associated with light of a particular wavelength of intensity $I_o$, and if $t$ is an induction period associated with light of the same wavelength of intensity I, then the following relation appears to be generally valid:

$$I_o^n t_p = I^n t \quad (2)$$

where the exponent $n$ usually is less than unity but greater than zero. By combing Equations 1 and 2, we can eliminate light intensity terms $I_o$ and I and obtain an expression relating induction periods to the optical density of a point on a negative which gives rise to these induction periods.

$$t=t_o 10^{nD} \quad (3)$$

This expression means that, if a negative is uniformly illuminated with light, the induction period of a photopolymer composition of this invention which is exposed to light through a negative whose optical density at the point in question is D is $10^{nD}$ times longer than the induction period which would be found if no negative were present. If $t$ is an induction period associated with a particular intensity of light of a particular wavelength and a particular photopolymer composition, and this particular photopolymer composition is exposed to light of said particular intensity and wavelength for a period of time $t_E$ such that $t_E<t$, then the remaining portion of the induction period is $t-t_E$. This is a fraction $(t-t_E)/t$ of the original induction period and, as disclosed in said Rust-Miller application, all other induction periods associated with other intensities are reduced to this same fraction by such exposure. Furthermore, the fractional reduction in the induction period $t$ due to such exposure will be equal to $t_E/t$ which, in view of Equation 3 is equal to $$(t_E/t_o)10^{-nD}$$

Since $t_E$ and $t_o$ will be fixed for a particular exposure, the reduction in induction time will depend only on the densities of the object, that is, the photographic negative. This means that after an exposure of a light-sensitive composition to radiation transmitted through a photographic image, for a time less than the induction time associated with the wavelengths of maximum intensity in the incident radiation, a latent or non-visible image will be formed in the light-sensitive composition. This latent image is in the form of a distribution of reduced induction periods such that this distribution of reduced induction periods faithfully represents the distribution of densities in the photographic negative and, more generally, represents the distribution of radiation intensities in the incident radiation.

To be of real value, the latent image must be made visible or "developed." Development of the latent image is accomplished by optical means as compared with chemical development of silver halide images. After the image-forming exposure, development is accomplished by irradiating the light-sensitive composition uniformly with any appropriate actinic radiation for a time which is at least sufficient to produce a visible photopolymer image, but which is preferably equal to or less than the induction period associated with such actinic radiation to prevent fogging of the initially unexposed areas. If some background fogging can be permitted, the uniform exposure may be continued for a time longer than the induction period associated with the developing light. Because the development exposure time is less than or equal to the induction period associated with the development radiation in the preferred method, a visible photopolymer image will be produced where the latent image exists because of the reduced induction periods in the area comprising the latent image; however, no visible image will be produced in the background, that is, in the initially unexposed areas because the induction period in the initially unexposed areas is longer than the development time for the latent image.

Assume that the developing light has an intensity of $I_D$ associated with the induction period $t_D$. Because of the above exposure $t_E$, this induction period is shortened to $(t-t_E/t)t_D$. If the developing time is T such that:

$$(t-t_E/t)t_D<T\leq t_D$$

then the print-out time $T_P$ during which photopolymer is being formed is:

$$T_p=T-(t-t_E/t)t_D \quad (4)$$

If we substitute Equation 3 into Equation 4, we obtain:

$$T_p=T-[1-(t_E/t_o)10^{-nD}]t_D \quad (5)$$

Since the developing time T is usually made approximately the same as the induction period to produce a photopolymer image of maximum optical density without background fog, we can place $T=t_D$ in Equation 5 and obtain:

$$T_p=T(t_E/t_o)10^{-nD} \quad (6)$$

It has been empirically determined with the photopolymers of this invention that the optical density ($D_p$) of a photopolymer image can be approximated by the expression:

$$D_p=D_{ps}(1-\text{Exp}(-kI_D{}^rT_p))=D_{ps}(1-\text{Exp}[-kI_D{}^r(t_E/t_D)T10^{-nD}]) \quad (7)$$

where $D_{ps}$ is the saturation optical density for infinitely long exposure time, Exp is the base of the natural logarithm, $k$ is a constant characteristic of the photopolymer composition under consideration, $I_D$ is the light intensity used for development; the exponent $r$ is usually less than unity and greater than zero, and $T_p$ is the exposure time measured from the end of the induction period.

Although this simplified analysis is essentially a crude approximation of the process of the present invention, the expression given by Equation 7 is generally in line with the observed facts. Usually, however, a more linear relation is found between $D_p$ and D. Because $D_{ps}$, $k$, $I_D{}^r$, $t_E/t_o$, T and $n$ are constant for a given experiment and photosensitive composition a graph of Equation 7 is instructive as shown in FIG. 1, where $n$ is given the value of 0.75 $D_{ps}$ the value 3, and in curves $a$, $b$, and $c$, the lumped constant $kI_D{}^r$ $(t_E/t_o)$ T is given the values 2, 3 and 4, respectively. The variation in the lumped constant can thought of as a variation in the ratio $t_E/t_o$. Regardless of the light intensity impinging on the negative, if the ratio $(t_E/t_o)$ is small there will be a close resemblance to curve $a$, whereas if the ratio is large (closer to unity, that is) then there will be a close resemblance to curve $c$.

From an examination of curves $a$, $b$ and $c$ of FIG. 1, it will be seen that when the optical density of a negative which is projected onto a photosensitive composition is relatively low, the optical density of the print is correspondingly high and vice versa. For example, for optical densities of a negative of 0.1 and 2.75, the print optical densities for curve $c$ are 2.9 and 0.1, respectively. Furthermore, as the ratio of $t_E/t_o$ increases towards unity, the print optical density increases. This can be seen by comparing the print optical densities represented on curves $a$, $b$ and $c$ for a particular optical density of a negative. For example, for an optical density of a negative of 1.0, the print optical density increases from 0.9 on curve $a$ (lowest ratio of $t_E/t_o$) to 1.55 on curve $c$ (highest ratio of $t_E/t_o$).

Although Equation 7 is not a constant for wide ranges of exposure time, it is essentially constant for the exposure times used in this photopolymerization method and therefore there is substantially no convergence of the lower and higher optical density points in the visible image. Therefore, the visible photopolymer image will be a faithful reproduction of the object which was initially projected onto the light-sensitive compositions.

Figure 2:
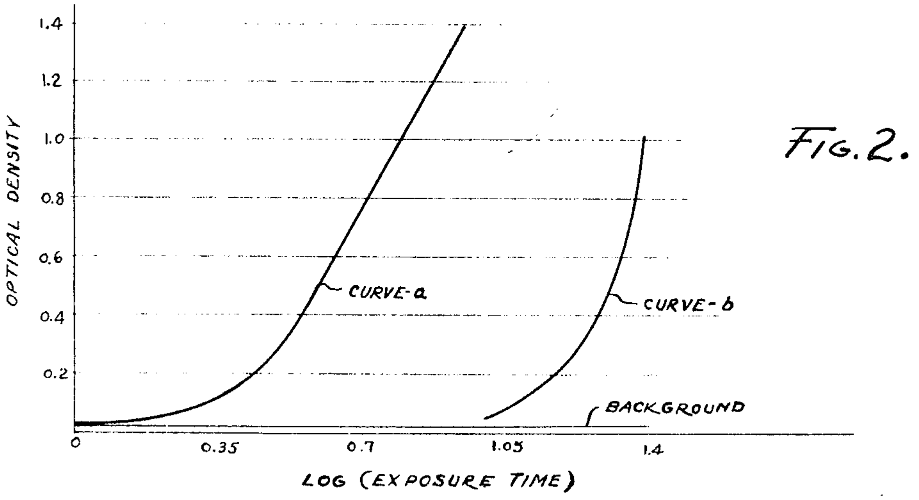
FIG. 2 is a graphical representation illustrating the direct relation between developed visible photopolymer image optical density and the length of the initial imaging exposure period for two different photosensitive compositions.

The production of a visible photopolymer image without background fogging is graphically illustrated by FIG. 2 which is a graphical illustration of the data of Example 2. Briefly, two photosensitive compositions ($a$ and $b$), each containing barium diacrylate monomer, sodium p-toluenesulfinate catalyst and methylene blue dye, were exposed to radiant energy to form a latent image and then the photosensitive compositions were uniformly exposed to developing actinic light to produce a visible photopolymer mass. The optical density of the photosensitive composition was measured prior to the initial exposure and after the photopolymer mass-forming or developing exposure, and such optical density is graphically illustrated by the curve designated "background" in FIG. 2. As will be seen from FIG. 2, the background optical density did not change, whereas the optical density of the latent image area in each photosensitive composition increased substantially following the latent image-forming step, as illustrated by curves $a$ and $b$ of FIG. 2.

As previously described, the latent image formed after the initial exposure is basically a distribution of modified induction periods, that is, a distribution of varying inhibitor concentrations. It is therefore possible that, with time, the inhibitor will migrate by diffusion from a more dense (in terms of inhibitor concentration) to a less dense area of the light-sensitive composition. The rate of migration of inhibitor will depend upon the viscosity of the light-sensitive composition and upon the nature and molecular weight of the inhibitor, that is, whether it is of very low or very high molecular weight. If this migration is allowed to occur, the latent image will lose definition and eventually disappear. Such migration or diffusion of the inhibitor after the latent image-forming exposure can be essentially eliminated by either performing the development step (2) immediately after the latent image-forming step (1) or by increasing the viscosity of the light-sensitive composition prior to the initial exposure with thickeners and/or by adding inhibitors of high molecular weight or by employing the methods together.

Generally, it is preferable to develop the latent image as soon after the latent image is formed as is possible. This is especially so where the viscosity of the light-sensitive composition is low. As the viscosity increases, the allowable time between development and latent image formation, without increased diffusion of the latent image, can be increased. In more viscous and solid mediums this allowable time can be very long.

To increase the viscosity, where necessary or desirable, a wide range of viscosity increasing compounds may be used. However, it is preferable to use those compounds which provide the greatest viscosity increase per unit amount of compound added to the light-sensitive composition. This is to ensure that the compounds added to increase viscosity will have a negligible inhibitory effect on the overall speed of photopolymerization. I have found that the addition of light transmitting film forming material as small quantities of gelatin, other suitable resinous material, cellulosic compounds, protein material, polyvinylalcohol, polyvinylpyrrolidone, and the like, effectively increase the viscosity of the light-sensitive composition. Such addition may ordinarily be in the range of about 5% to about 10% based on total weight.

These viscosity increasing compounds or thickeners, in addition to extending the life of the latent image, can also be employed to produce a photosensitive film composition, which composition can more readily be applied to a backing strip to produce a film for use in cameras, projection devices and the like. For example, the photosensitive and photopolymerizable film compositions as disclosed in Thommes Pat. No. 3,259,499 are applicable to the processing method herein described.

As previously described, polymerization inhibitors always are present in light-sensitive photopolymer compositions. These inhibitors may be of various kinds and they may be present in varying concentrations. Because of these unknown factors, it is not always possible to accurately predict or control the length of the induction periods. Therefore, it is within the scope of this invention to modify the light-sensitive composition by adding thereto a polymerization inhibitor to provide better control of the induction period. It is also within the scope of this invention to add inhibitors, and preferably inhibitors which increase the composition viscosity, to a photosensitive composition to reduce the migration of inhibitors within the composition and thereby increase the life of the initially-formed latent image. If inhibitors are to be added to a photosensitive composition, the inhibitor molecules should be as large as possible to prevent rapid diffusion away from their original positions in the light-sensitive composition. Additionally, the added inhibitors must be compatible with the other components in the light-sensitive composition and they must be soluble in the light-sensitive medium. Examples of such inhibitors are the compatible or mutually soluble transparent film-forming resinous materials as nitrated aromatic compounds such as nitrated polystyrene, and the like, or phenolic compounds such as phenolformaldehyde polymers and the like, and aromatic amine resins such as aniline-formaldehyde resins and the like.

The particular radiation wavelengths to be used for either the latent image-forming step or for the development step will depend upon the absorption spectra of the radiation-absorbing components of the light-sensitive compositions. In general, radiation in the visible wavelength range between about 3800 angstroms to about 7200 angstroms will be utilizable. However, the photosensitive initiator may comprise a photo-oxidant capable of being raised to a photo-active state by absorbing radiant energy having wavelengths lying between about 2000 A. and about 7200 A.

The rate at which photopolymerization can be effected by the method of this invention is primarily dependent upon two factors: (1) the length of the induction period associated with the latent image-forming radiant energy; and (2) the intensity of and duration of the radiation used for development. Since the development exposure time varies with the intensity of the exposing radiation, the intensity of the developing radiation can be increased to where the development time is extremely short, e.g., about 0.1 second.

As disclosed in said co-pending Rust-Miller application any photopolymerization induction period can be shortened by the therein-described method of presensitization. The presensitization method of said Rust-Miller application comprises initially uniformly irradiating a photosensitive composition with actinic radiant energy for a time less than or equal to the induction period associated with such radiant energy and photosensitive composition. Rather than directly thereafter further irradiating the photosensitive composition with actinic radiant energy in a desired pattern to form a visible photopolymer image as described therein, the method described herein can follow said presensitizing step. That is, after the presensitizing step, the image is impressed in the photosensitive composition by its being irradiated with actinic radiant energy for a time less than or equal to the reduced induction period associated with such radiant energy and thereafter uniformly irradiated with actinic radiation to develop the latent image. Since the presensitizing step can shorten the induction period to vanishingly small values, it will be understood that extremely weak radiation sources, or momentarily brighter radiation sources, can be utilized to form latent images which can thereafter be made visible by other and more intensified or constant radiation sources, with or without desensitizing and fixing the image.

After formation of a visible photopolymer image, fixation or desensitization may be accomplished by any known method. For example, the photosensitive components in the light-sensitive composition may be removed by any suitable solvent. Additionally, desensitization may be accomplished by the optical methods described in copending applications entitled: "Photopolymer Polymerization Fixation Process and Products," as indicated Leroy J. Miller and John B. Rust, "Photopolymer Fixation Process and Products," John B. Rust, and "Method of Inhibiting Photopolymerization and Products," Ser. No. 583,651, J. David Margerum, and assigned to the instant assignee.

All photosensitive compositions containing a polymerizable monomer and photosensitive polymerization initiator are characterized by the inherent presence of, or added, temporary inhibitors which, in turn, cause induction periods, or delay in image reproduction, when such compositions are irradiated, or the image is irradiated thereon by actinic radiation. Therefore, the method of this invention can be employed with any such prior art photosensitive compositions. For example, the prior art photosensitive compositions which are described in U.S. Patents Nos. 3,259,499 and 3,255,004 of G. A. Thommes, 2,875,047 of Gerald Oster, and the like, preferably modified to a very viscous gel or solid state film composition, as provided, or including a viscosity increasing material as contemplated herein, may be employed with the method of this invention. The disclosures of U.S. Patents Nos. 3,259,499, 3,255,004 and 2,875,047, including similar and like photosensitive polymerizable compositions, are incorporated herein by reference.

Since the method of this invention is most useful when employed with the photosensitive compositions which can be rapidly polymerized, it is preferable to use the photosensitive compositions described in the copending applications of John B. Rust, each of which is entitled "Photopolymers and the Process of Making Same," Ser. No. 450,397, filed Apr. 23, 1965, now abandoned, and Ser. No. 483,986, filed Aug. 31, 1965, now abandoned, each application being assigned to the instant assignee (herein designated as "said Rust applications"). The photosensitive compositions of said Rust applications are incorporated herein by reference.

In general, the light-sensitive compositions described in said Rust applications include, in combination, a vinyl monomer and a photo-redox catalyst system. The photo-redox catalyst system includes a photo-oxidant capable of being raised to a photo-active state by absorption of visible light having wavelengths lying between about 3800 A. and about 7200 A. Whereas herein it has been discovered that a very low level of actinic radiation, and on the order of 3800 A. and above, may be utilized to impress an invisible or latent image in the photosensitive composition and this initial impression can be made visible without further image impression by means of more visible light illuminating the photosensitive composition.

The polymerizable monomers will be designated by the term "vinyl monomers" which includes vinylidene monomers ($CH_2=CY_2$), fluorocarbon monomers, and the like light-sensitive polymerizable monomers. Examples of vinyl monomers are butadiene, vinyl chloride, vinylidene chloride, vinyl methyl ether, vinyl butyl ether, vinyl butyrate, styrene, vinyl benzoate, methyl methacrylate, calcium diacrylate, barium diacrylate, acrylic acid, acrylonitrile and acrylamide. Monomers having a functionality greater than two may also be used where it is desirable to produce highly cross-linked polymers which are insoluble and infusible at a low degree of conversion. Use of cross-linking monomers permits formation of discernible images at lower radiation levels that can be produced in the same exposure period using light-sensitive compositions without cross-linking monomers. Such monomers may be employed in combination with monomers having a functionality of two or they may be used alone. Cross-linking monomers usable in my invention are typified by: N,N'-alkylenebisacrylamides, secondary acrylamides, tertiary acrylamides, di- or trivalent metal salts of acrylic or methacrylic acid, and the like.

The amount of vinyl monomer in the reaction medium can vary within extremely wide limits. On the one hand, the amount of monomer employed may be the maximum solubility of the particular monomer in a particular solvent. On the other hand, the monomer may be present in small molar concentrations of the order of $10^{-2}$ or $10^{-3}$ molar. The concentration of the vinyl monomer is above about $2.5 \times 10^{-3}$ moles/liter. When a monomer having a functionality greater than two is employed in combination with a monomer having a functionality equal to two, the latter monomer is employed in an amount ranging from 10 to 50 parts per part of cross-linking agent.

Hereafter, the terms "molars per liter" and "molar" will be used to designate "moles per liter of photosensitive composition."

The preferred photo-oxidants usable in the process of this invention are those disclosed in the said Rust applications and are incorporated herein by reference. More specifically, they are photoactivable members of the quinoidol dye family, such as phenothiazine dyes, phenazine dyes, acridene dyes, xanthene dyes, phenoxazine dyes and pyronine dyes capable of effecting photopolymerization of the photosensitive polymerizable monomer compositions. For example, such dyes as methylene blue, fluorescein, rose bengal, erythrosin B, eosin B, phloxine B, acridine orange, thioflavin, thionine, azure A, B and C, methylene green, toluidine blue O, safranine O, pyronine B, proflavine, acridine yellow, rhodamine B, riboflavin, and the like. It being understood that some dyes are more active than others with respect to the interrelationship of photosensitive polymerization, inhibition and induction period, technical judgement for practical accomplishment of visually observable image reproduction in the photosensitive composition is necessary.

The minimum required concentration of photo-oxidant of the photo-redox catalyst system is approximately $10^{-7}$ moles per liter. As the photo-oxidant concentration is increased above this minimum concentration, the sensitivity of the photopolymer composition does increase; however, the sensitivity may pass through a maximum as the photo-oxidant concentration is further increased so that it may be desirable to avoid high concentrations ($10^{-2}$ moles per liter or more), especially when the photosensitive solution to be polymerized is of greater thickness than a very thin film. However, since the optical properties of the photo-oxidant are dependent upon the quantities present, as well as upon the intensity of the radiation employed, the criteria for determining the proper or practical quantities of photo-oxidant and of catalyst to be employed will be governed by considerations other than just the amount needed for catalyzing the photopolymerization reaction.

The catalysts of said Rust applications are the organic sulfinic acids and deviations thereof, the triorgano-substituted phosphines and the triorgano-substituted arsines. Only catalytic amounts of these catalysts are required for rapid photopolymerization of the vinyl monomer. Thus, photopolymerization may be achieved in the method of this invention by employing concentrations of the catalyst as small as $1 \times 10^{-6}$ moles per liter. Higher concentrations, e.g., about $10^{-2}$ molar, may result in somewhat accelerated rates of photopolymerization.

The organic sulfinic compounds of said Rust patent applications are the aromatic and aliphatic organic sulfinic acids and certain derivatives thereof. The derivatives of the organic sulfinic acids which can be employed are the salts, organic esters, sulfinyl halides and sulfinamides of the organic sulfinic acids. Each of these organic sulfinic compounds is characterized by its ability to form a free radical by giving up an electron to the photo-oxidant in its activated or photoactive state. In the free radical form, the organic sulfinic compounds are capable of initiating polymerization of the aforedescribed vinyl monomers.

Examples of organic sulfinic acids are: p-toluene-sulfinic acid, benzenesulfinic acid, p-bromobenzenesulfinic acid, napthalenesulfinic acid, 4 - acetaminobenzenesulfinic acid, 5 - salicylsulfinic acid, ethanesulfinic acid, 1,4-butanedisulfinic acid, and α-toluenesulfinic acid. The salts of these acids may be any of the soluble salts which are compatible with the other components employed in the photosensitive solution anl typically include the sodium salts, the potassium salts, the lithium salts, the magnesium salts, the calcium salts, the barium salts, the silver salts, the zinc salts and the aluminum salts. Appropriate esters of these acids typically include the methyl esters, the ethyl esters, the propyl esters and the butyl esters. The halogen derivatives of the organic sulfinic acids include the sulfinyl chlorides, for example, ethanesulfinyl-chloride and 5 - salicylsulfinyl bromide. Examples of the organic sulfinamides are the sulfinamides such as ethane-sulfinamide; the N-alkylsulfinamides such as N-methyl-p-toluenesulfinamide; and the N-arylsulfinamides such as N-phenylbenzenesulfinamide.

The triorgano-substituted phosphine and arsine or compounds thereof suitable for use in the practice of the present invention have the general formula:

where R, R' and R" may be alkyl, aryl, aralkyl or alkaryl groups.

As the triorgano-substituted phosphine or arsine for use in the present invention, I may employ, for example, such appropriate phosphine compounds as tributyl phosphine, triphenyl phosphine, dibutylphenyl phosphine, methyldiphenyl phosphine, and methylbutylphenyl phosphine. Examples of appropriate triorgano-substituted arsine compounds are triphenyl arsine, methyldiphenyl arsine, trioctyl arsine, dibutylphenyl arsine, and methylbutylphenyl arsine.

Only catalytic amounts of members of the sulfinic acid group, of the triorgano-substituted phosphine group and of the triorgano-substituted arsine group are needed with the photo-oxidants of said Rust applications. Thus, photopolymerization may be achieved by using concentrations of these catalysts as small as $10^{-6}$ moles per liter.

In general, the light-sensitive composition is prepared by bringing together (a) a vinyl monomer and (b) a photosensitive polymerization initiator. When the photosensitive polymerization initiator comprises a photo-oxidant and a catalyst, the photosensitive initiator may first be made up and then added to the vinyl monomer or, either one of the initiator components may be added to the monomer and the resulting admixture then added to the other component of the polymerization initiator. Each of the components (a) and (b) is preferably added to a medium, such as a solution, before being mixed with the other component.

The photopolymerization process of the present invention is preferably carried out in a solution of the above components. The particular solvent employed will depend upon the solubility of the components (a) and (b). Thus, if all the components are water soluble such as in a light-sensitive system employing, for example, acrylamide as the vinyl monomer, thionine as the photo-oxidant and tributylphosphine as the catalyst, an aqueous solution may be employed. Where a common solvent for the compounds is not available, different solvents which are miscible with each other may be employed. I have used as suitable solvents in the process of the present invention water, alcohols such as methanol, glycerol ethylene glycol, and dioxane.

Dispersions may also be used in effecting the presensitization and photopolymerization. Resort to dispersions may be had where it is desirable to use an insoluble monomer of photosensitive initiator system. In general, however, I prefer not to use dispersions since the particulate matter tends to scatter the light or radiation used in the photopolymerization process.

The following examples further illustrate the method with preferred type compositions of this invention and are not to be construed as placing limits upon the invention. Each of these examples employed relatively low intensity light to provide induction times which would best graphically illustrate the scope of this invention. When higher intensity radiation sources have been used, the overall photopolymerization time has been reduced to about 0.4 second. However, such rapid photopolymer formation does not easily lend itself to measurement and analysis. For this reason, the longer induction periods of the following examples were used.

EXAMPLE 1

This example illustrates the effect on the visible image of varying the initial latent imaging exposure time and of varying the total exposure time. Additionally, it illustrates the effect of varying the initial latent imaging exposure and development times in relation to a range of induction periods.

A series of photosensitive compositions were prepared in the dark. The compositions were placed on a thin glass plate having a peripheral plastic spaced 6 mils thick around the edges. A second thin glass plate was placed over the photosensitive composition and spacer and sealed at the edges. The assembly then consisted of a 0.006 inch film of photosensitive composition between two thin glass plates. The photosensitive compositions (a), (b), (c), (d) and (e) were made up as follows:

(a) 4 ml. of monomer solution consisting of 35 percent wt./vol. aqueous barium diacrylate (filtered to obtain a clear solution); and 1 ml. of photocatalyst solution consisting of 2.14 grams sodium p-toluenesulfinate dihydrate and 0.03 gram methylene blue dissolved in 100 ml. of distilled water.

(b) 4 ml. of monomer solution consisting of 35 percent wt./vol. aqueous barium diacrylate; and 1 ml. of photocatalyst solution consisting of 2.14 grams sodium p-toluenesulfinate dihydrate and 0.03 gram methylene blue dissolved in 100 ml. of distilled water.

(c), (d) and (e) 4 ml. of monomer solution consisting of 70 percent wt./vol. aqueous barium diacrylate, lead diacrylate mixture (0.9 molar to 0.1 molar); and 1 ml. of photocatalyst solution consisting of 2.14 grams sodium p-toluenesulfinate dihydrate and 0.03 gram methylene blue disolved in 100 ml. of distilled water.

The induction period was determined for white light having an approximate intensity of $1\times10^{-3}$ watts per square centimeter ($I_0$). Using neutral density filters of 1 and 2, the induction periods of $I_0/10$ and $I_0/100$ were determined. Each of the light-sensitive compositions (a), (b), (c), (d) and (e) was exposed to a projected negative using light of intensity $I_0$ for a time equal to or less than the induction time associated with $I_0$. The resulting latent images were developed with light of intensity $I_0/10$ or $I_0/100$ as shown in Table 1.

The results and observations are shown in Table 1. Comparison of (c), (d) and (e) shows that the average density of the visible photopolymer image is proportional to the latent image-forming time when the development time is constant. Comparison of (b) with (a), (c), (d) and (e) illustrates the effect of increasing time on diffusion of the inhibitor. That is, in (b) where longer exposure times were used, the inhibitor had a longer time to diffuse to other parts of the light-sensitive composition thereby causing some blurring of the visible image.

TABLE 1

| Composition | Induction period (sec.) | | | Initial exposure, sec. | Development exposure, sec. | Remarks |
|---|---|---|---|---|---|---|
| | $I_0$ | $I_0/10$ | $I_0/100$ | | | |
| (a) | 1 | | 13 | 0.5 | 13 | Invisible latent image. A good print was secured after developing with light with slight blurring of image. |
| (b) | 9 | 63 | | 8 | 63 | Invisible latent image. A good print was secured after developing with light but blurring was more noticeable due to diffusion of latent image. |
| (c) | 0.4 | 5.4 | | 0.4 | 5.4 | Invisible latent image. A very good print was secured after developing with light and no blurring could be detected. |
| (d) | 0.4 | 5.4 | | 0.1 | 5.4 | Invisible latent image. An exceptionally clear and non-blurred print came up after developing with light. |
| (e) | 0.4 | 5.4 | | 0.04 | 5.4 | Invisible latent image. A faint, but non-blurred print was secured after developing with light. |

EXAMPLE 1A

The above photosensitive monomer composition (a) of Example 1 when mixed with a thickener and coated on a base substrate produced comparable results illustrating that the method herein provided is applicable thereto. For example, 4 ml. of the monomer solution was mixed with 0.4 gram of a 45% commercial grade aqueous solution of polyvinylpyrrolidone (PVPK-30) and coated on a cellulose acetate substrate to produce a flexible photosensitive film capable of receiving an impression of a latent image and providing a visible image thereof by the process herein described.

Other suitable film-forming thickeners as hydroxyethyl cellulose, proteinaceous material as zein, and the like, polyethylene glycols as carbowax used in limited amounts, methyl ethyl cellulose, carboxy alkyl cellulose, as carboxy methyl or ethyl cellulose, and the like, and the soluble salts of such carboxy alkyl celluloses, and the like, other resinous materials may be used, with care being taken not to cause excessive precipitation and interference with photosensitive reproduction of the image impression in the photosensitive monomer composition. When coated on a suitable substrate base, as glass, resin film cellulosic material, as cellulose acetate, and the like, the thickened more viscous photosensitive monomer films reproduced image impressions by the process herein described. One or more coatings of the polymerizable photosensitive compositions can be applied to a suitable substrate in the manner disclosed in U.S. Pat. Nos. 3,255,004 and 3,259,499, included by reference thereto. As, in fact, the photosensitive compositions therein described as supported or unsupported photosensitive films are applicable herein to the processing as described and claimed.

EXAMPLE 2

This example illustrates the relation of the density of the visible photopolymer image to the initial latent imaging exposure time when the development exposure time is a constant. It further illustrates the effect on the length of the induction period of changes in the composition of the light-sensitive material.

Two photosensitive compositions were prepared in the dark as follows:

(a) 4 ml. of 35 percent wt./vol. aqueous barium diacrylate; and 1 ml. of photocatalyst solution consisting of 2.14 grams sodium p-toluenesulfinate dihydrate and 0.03 gram methylene blue dissolved in 100 ml. of distilled water.

(b) 4 ml. of 35 percent wt./vol. 0.8 molar barium diacrylate and 0.2 mole lead diacrylic aqueous solution; and 1 ml. of photocatalyst solution consisting of 2.14 grams sodium p-toluenesulfinate dihydrate and 0.03 gram methylene blue dissolved in 100 ml. of distilled water.

These compositions were sealed between glass plates as described in Example 1 to give a film 0.006 inch thick. Using white light having an intensity of $2.3\times10^{-4}$ watts/cm.$^2$, the induction period was determined to be 26 seconds for composition (a) and 10.5 seconds for composition (b). Using light having an intensity of $1.15\times10^{-4}$ watts/cm.$^2$, the induction period was determined to be 144 seconds for composition (a) and 54 seconds for composition (b). The naturally occurring optical density of the film of photosensitive composition was determined to be $D=0.02$ and, after development with light, the background density was still $D=0.02$.

Various spots in the photosensitive compositions were exposed to light having an intensity of $2.3\times10^{-4}$ watts/cm.$^2$ for various periods of time as indicated in Table 2. Then composition (a) and composition (b) were illuminated uniformly with light having an intensity of $1.15\times10^{-4}$ watts/cm.$^2$ for a time of 144 seconds and 43 seconds, respectively. The optical densities of the irradiated spots were recorded.

Table 2 gives the results of the experiment and FIG. 1 is a graph of the optical density vs. the logarithm of the initial latent imaging exposure time.

TABLE 2

| Spot density of visible image | | Initial latent imaging exposure time, seconds | | Log initial latent imaging exposure time | |
|---|---|---|---|---|---|
| (a) | (b) | (a) | (b) | (a) | (b) |
| .92 | 1.47 | 24 | 9 | 1.38 | 0.95 |
| .52 | 1.14 | 20 | 7 | 1.30 | 0.85 |
| .22 | .78 | 15 | 5 | 1.18 | 0.70 |
| .05 | .25 | 10 | 3 | 1.00 | 0.48 |
| ------------ | .02 | ------------ | 1 | ------------ | 0.00 |

It can be seen that the initially non-visible latent image at a given spot is developed by light to yield a visible image whose density is governed by the initial exposure. Additionally, it can be seen that the background density remains constant indicating no photopolymer formation in the background.

EXAMPLE 3

This example illustrates the effect of including silver nitrate, a heat active desensitizing agent, in the light-sensitive composition.

A photosensitive composition was prepared in the dark as follows:

4 ml. of 35 percent wt./vol. aqueous barium diacrylate; 1 ml. of 0.1 molar silver nitrate solution; and 1 ml. of photocatalyst solution consisting of 2.14 grams sodium p-toluene-sulfinate dihydrate and 0.03 gram methylene blue dissolved in 100 ml. of distilled water.

The procedure for making the photosensitive film, its exposure and the light intensities were the same as in Example 2. In this example, the naturally occurring optical density of the photosensitive film was found to be $D=0.02$ and it was still $D=0.02$ after developing exposure to light. In this case, the induction period using light of intensity $2.3\times10^{-4}$ watts/cm.$^2$ was 55 seconds, and using light of $1.15\times10^{-4}$ watts/cm.$^2$ the induction period was 460 seconds. Development was carried out with light of intensity $1.15\times10^{-4}$ watts/cm.$^2$ for a time of 444 seconds.

In the following Table 3, the exposure times to light of intensity $2.3\times10^{-4}$ watts/cm.$^2$ are given and the optical density of the exposed spots after development with light are recorded.

TABLE 3

| Spot density | Exposure time, sec. | Log exposure time |
|---|---|---|
| .66 | 52 | 1.72 |
| .10 | 45 | 1.65 |
| .08 | 40 | 1.60 |

Figure 3:
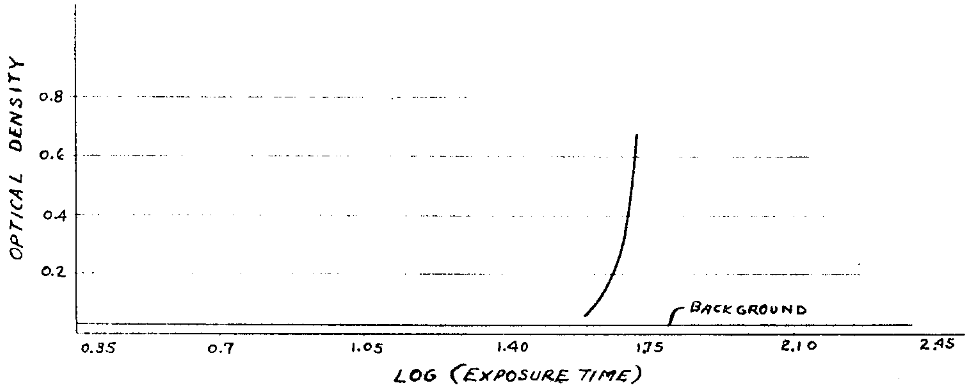
FIG. 3 is a graphical representation illustrating the effect on induction time and developed visible photopolymer image optical density of including in a photosensitive composition a polymerization desensitizing or fixing agent such as silver nitrate.

FIG. 3 gives a graph of these results. Although the presence of silver ion has an effect of lengthening the induction period, it appears to accelerate the polymerization after the induction period has been exceeded. This can be seen from a comparison of the curve of FIG. 3 with curve *b* of FIG. 2, both curves representing the same photosensitive compositions except that the photosensitive composition represented by FIG. 3 contains silver nitrate.

The examples, when in a properly controlled pH range, or containing a soluble silver salt as silver nitrate, when heated to about 80° C. retained the images without further polymerization upon exposure to additional visible light and projection.

EXAMPLE 4

Illustrative of the addition of desensitizing agents to a photosensitive polymerizable composition and which do not interfere with the initial latent image and development formation steps are those described in the copending application of J. David Margerum entitled "Method of Inhibiting Photopolymerization and Products," Ser. No. 583,651, and preferably include 4-nitrophenylacetic acid, 4-nitrohomophthalic acid, 4,4′-dinitrodiphenylacetic acid, 2-(4′-nitrobenzyl) benzoic acid, 5-nitro-o-toluic acid and the soluble salts of such acids, including the higher molecular weight reaction products from photolysis of sodium 4-nitrohomophthalate, and the like.

The photosensensitive composition was prepared in the absence of visible radiation from:

4 ml. 35 percent wt./vol. 0.8 molar barium diacrylate and 0.2 mole lead diacrylate aqueous solution 1 ml. photocatalyst (Example 1).

The procedure of making the photosensitive film, methods of exposure and intensities of illumination were the same as in Example 2. In the present case, the induction period at an intensity of $2.3\times10^{-4}$ watts/cm.$^2$ was 10.5 seconds, and the induction period at an intensity of $1.15\times10^{-4}$ watts/cm.$^2$ was 54 seconds. The development exposure time at an intensity of $1.15\times10^{-4}$ watts/cm.$^2$ was 43 seconds. Various exposures were made at $2.3\times10^{-4}$ watts/cm.$^2$ and the density of the developed spots were recorded in the following Table 4.

TABLE 4

| Spot density | Exposure time, sec. | Log exposure time |
|---|---|---|
| 1.47 | 9 | 0.95 |
| 1.14 | 7 | 0.85 |
| .78 | 5 | 0.70 |
| .25 | 3 | 0.48 |
| .02 | 1 | 0.00 |

Upon modifying the above photosensitive composition with an aqueous solution of 0.1 M sodium 4-nitrophenylacetate in the proportion of approximately 1 part desensitizer solution to 10 parts photosensitive composition to obtain a ratio on the order of $1\times10^{-4}$ M methylene blues to 0.1 M desensitizer and following the above procedure of making the photosensitive film and methods of exposure, no material change in the data was observed other than the ability to prolong fixation of the developed photopolymer image upon its subsequent exposure to ultraviolet radiation.

Figure 4:
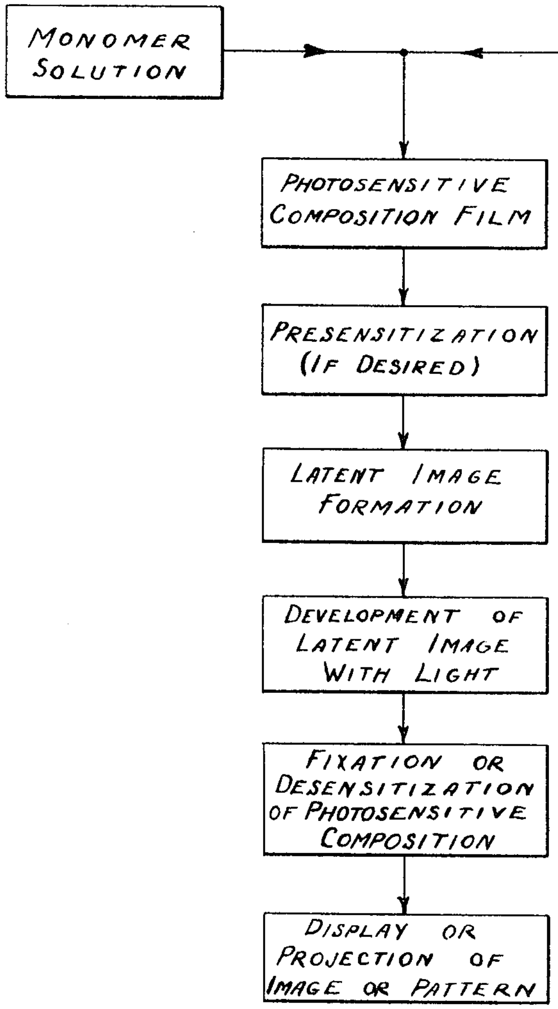
FIG. 4 is a schematic view in self-explanatory block form of the process embodied herein.

As shown by the foregoing description and examples, in conjunction with the processing outlined in FIG. 4, a light-sensitive composition capable of polymerizing upon irradiation with radiant energy of appropriate wavelengths, can be rapidly polymerized by the method of my invention by first forming a latent image in the light-sensitive composition and then developing the latent image to a visible image having excellent definition. Since the formation of a latent image requires relatively small amounts of incident radiation, the method of this invention permits the formation of photopolymer images by utilizing short-lived and weak radiation, heretofore useless in photopolymerization processes, to form a latent image which exactly duplicates the projected object. Development of the latent image to a visible photopolymer image can be carried out using any available radiation capable of absorption by the light-sensitive compostion. Because the development exposure time is less than or equal to the induction period associated with the development radiation in the preferred method, only the latent image is made visible—the background remains substantially as it was before development thereby permitting the formation of well-defined, visible photopolymer images.

While certain embodiments are disclosed herein, modifications which lie within the scope of this invention will occur to those skilled in the art. I intend to be bound only by the scope of the claims which follow.

What is claimed is:

1. A method of producing a visible photopolymer image in a film of photosensitive composition supported on a substrate said composition containing a uniform dispersion of photopolymerizable ethylenic vinyl monomer, a photosensitive polymerization initiator system comprising a combination of a photo-oxidant dye from the quinoidal family and catalyst selected from the group consisting of an organic sulfinic compound, a triorgano-substituted phosphine and a triorgano-substituted arsine, said system is capable of initiating addition polymerization of said monomer when irradiated with actinic radiant energy in the wavelength range of about 3800 A. to about 7200 A. and an addition photopolymerization inhibitor which provides said film with an induction period of exposure to said radiation necessary to exhaust inhibitor in an irradiated area of the film before the onset of polymerization; comprising the steps of:

irradiating said film with an imagewise pattern of radiation having wavelengths within said range to form a non-visible latent image pattern of reduced inhibitor concentration in the irradiated image pattern areas and a higher concentration of inhibitor in the non-irradiated background areas of said film;

terminating said imagewise radiation before said inhibitor is exhausted in said irradiated areas and before polymerization has been initiated;

then uniformly irradiating said film across the surface thereof with radiation within said wavelength range until said inhibitor is exhausted in said image exposed areas and said image areas are photopolymerized to form a solid photopolymerized mass in the form of a visible pattern having viewable optical density; and terminating said uniform radiation before the induction period of said background areas is completed and before exhaustion of inhibitor therein to prevent polymerization in said background areas.

2. A method according to claim 1 in which at least one addition photopolymerization inhibitor having a high molecular weight and a low diffusion rate within said film is present in said composition.

3. A method according to claim 2 in which said high molecular weight inhibitor is a soluble resinous material selected from the group consisting of nitrated aromatic resins, aromatic phenolic resins and aromatic amine resins.

4. A method according to claim 1 further including the step of presensitizing said composition to reduce the induction period thereof by uniformly applying across the surface of said film before applying said imagewise radiation, radiation within said wavelength range at an intensity and for a period sufficient to uniformly reduce the inhibitor content of said film but insufficient to exhaust said inhibitor content.

5. A method according to claim 1 further including the step of desensitizing said composition and film after formation of said visible image.

6. A method according to claim 1 in which said quinoidal dye is selected from the group consisting of phenothiazine dyes, phenazine dyes, acridine dyes, xanthene dyes and pyronine dyes.

7. A method according to claim 5 in which said photosensitive composition includes a desensitizing agent selected from the group consisting of 4-nitrophenylacetic acid, 4-nitrohomophthalic acid, 4,4'-dinitrophenylacetic acid, 2-(4'-nitrobenzyl) benzoic acid, 5-nitro-o-toluic acid and soluble salts of such acids wherein said film is desensitized after formation of said visible image by uniformly irradiating said film to ultraviolet radiation.

8. A method of forming a visible photopolymer image in a film of photosensitive composition supported on a substrate, said composition containing a uniform dispersion of:

(1) at least one addition polymerizable, ethylenically unsaturated monomer capable of forming a high molecular weight solid polymer by free-radical initiated, chain propagation addition polymerization;

(2) a free radical generating addition polymerization initiator system activatible by visible radiation having wavelengths lying in the range between about 3800 A. and about 7200 A. to photopolymerize said film and consisting essentially of a photo-oxidant dye selected from the group consisting of phenothiazine dyes, phenazine dyes, acridine dyes, xanthene dyes and pyronine dyes in combination with a catalyst selected from the group consisting of an organic sulfinic compound, a triorgano-substituted phosphine compound and a triorgano substituted arsine compound; and (3) an addition polymerization inhibitor providing said film with an induction period of exposure to said radiation necessary to exhaust said inhibitor in an irradiated area of the film before the onset of addition polymerization; the steps comprising:

imagewise exposing said film by applying to a surface of said film an imagewise pattern of radiation having wavelengths within said range to form a non-visible, latent image pattern in said film of reduced inhibitor concentration corresponding to said irradiated areas and a pattern of higher inhibitor concentration corresponding to the non-irradiated background areas of the film;

terminating said exposing radiation before inhibitor is exhausted in said irradiated areas and before polymerization has been initiated to form a non-visible, latent image pattern;

then developing said latent image to a visible image by uniformly irradiating substantially the total surface of said film with radiation within said wavelength range until said inhibitor is consumed within said image areas and said image areas are photopolymerized to form a solid, visible patern having viewable optical density;

terminating application of said developing radiation to said film before the induction period of the background areas of the film is completed and before consumption of inhibitor therein to prevent polymerization in said background areas; and then fixing the film to prevent further polymerization.

9. A method according to claim 8 further including the step of presensitizing said composition to reduce the induction period thereof by uniformly applying across the surface of said film before applying said imagewise radiation, radiation within said range at an intensity and for a period sufficient to uniformly reduce the inhibitor content of said film but insufficient to exhaust said inhibitor content.

10. The method of claim 1 wherein the viscosity of said photosensitive composition is increased by the addition of a film forming thickening agent selected from the group consisting of polyvinylalcohol, polyvinylpyrrolidone, protein material, cellulosic material and glycol material.

References Cited

UNITED STATES PATENTS

| | | | |
|---|---|---|---|
| 2,760,863 | 8/1956 | Plambeck | 96—115 |
| 2,875,047 | 2/1959 | Oster | 96—35.1 |
| 2,989,455 | 6/1961 | Neugebauer et al. | 204—159.23 |
| 3,042,519 | 7/1962 | Wainer | 96—115X |
| 3,047,422 | 7/1962 | Sites et al. | 96—115X |
| 3,050,390 | 8/1962 | Levinos et al. | 96—35.1 |
| 3,144,331 | 8/1964 | Thommes | 96—48X |
| 3,331,761 | 7/1967 | Mao | 204—159.23 |
| 3,352,772 | 11/1967 | Mao | 204—159.24 |
| 3,380,825 | 4/1968 | Webers | 96—115X |
| 3,408,191 | 10/1968 | Jeffers | 96—35.1X |

OTHER REFERENCES

Oster, G., "Photographic Science and Eng.," vol. 4, No. 4, July-August 1960, pp. 237–239.

NORMAN G. TORCHIN, Primary Examiner

C. L. BOWERS, Jr., Assistant Examiner

U.S. Cl. X.R.

96—35.1, 48, 115